(12) United States Patent
Yang et al.

(10) Patent No.: US 9,093,613 B2
(45) Date of Patent: Jul. 28, 2015

(54) ELECTRODE STRUCTURE AND LIGHT EMITTING DIODE STRUCTURE HAVING THE SAME

(71) Applicant: Lextar Electronics Corporation, Hsinchu (TW)

(72) Inventors: Tsung-Yu Yang, Zhubei (TW); Tzong-Liang Tsai, Taichung (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/247,408

(22) Filed: Apr. 8, 2014

(65) Prior Publication Data
US 2015/0115301 A1    Apr. 30, 2015

(30) Foreign Application Priority Data
Oct. 24, 2013   (TW) .............................. 102138493 A

(51) Int. Cl.
*H01L 33/36* (2010.01)
*H01L 33/40* (2010.01)
*H01L 33/42* (2010.01)
*H01L 33/46* (2010.01)

(52) U.S. Cl.
CPC .............. *H01L 33/405* (2013.01); *H01L 33/42* (2013.01); *H01L 33/36* (2013.01); *H01L 33/46* (2013.01)

(58) Field of Classification Search
CPC .............................. H01L 33/46; H01L 33/405
USPC ....................... 257/98, 99, E33.062, E33.063
See application file for complete search history.

(56) References Cited

U.S. PATENT DOCUMENTS

| | | | | |
|---|---|---|---|---|
| 5,345,108 | A * | 9/1994 | Kikkawa | 257/751 |
| 5,355,020 | A * | 10/1994 | Lee et al. | 257/741 |
| 6,921,928 | B2 | 7/2005 | Sonobe | |
| 7,190,111 | B2 * | 3/2007 | Lee et al. | 313/503 |
| 7,355,212 | B2 * | 4/2008 | Okazaki et al. | 257/98 |
| 8,395,176 | B2 | 3/2013 | Seong et al. | |
| 2004/0046266 | A1 * | 3/2004 | Akamatsu et al. | 257/784 |
| 2005/0208688 | A1 * | 9/2005 | Otoma et al. | 438/22 |
| 2006/0071592 | A1 * | 4/2006 | Narasimhan et al. | 313/506 |
| 2009/0184329 | A1 * | 7/2009 | Miki et al. | 257/79 |
| 2011/0062484 | A1 | 3/2011 | Tanaka et al. | |
| 2012/0199866 | A1 * | 8/2012 | Iwanari et al. | 257/98 |
| 2012/0305939 | A1 * | 12/2012 | Slater et al. | 257/76 |
| 2013/0146922 | A1 * | 6/2013 | Kim et al. | 257/98 |
| 2013/0209927 | A1 * | 8/2013 | Deweerd | 430/5 |
| 2013/0307002 | A1 * | 11/2013 | Ko et al. | 257/98 |
| 2014/0170413 | A1 * | 6/2014 | Hassan et al. | 428/336 |

FOREIGN PATENT DOCUMENTS

| | | | |
|---|---|---|---|
| JP | 2000164928 A | | 6/2000 |
| JP | 2007265708 A | * | 10/2007 |
| JP | 2008041866 A | | 2/2008 |
| JP | 2009033210 A | | 2/2009 |
| JP | 2013048199 A | | 3/2013 |
| JP | 2013131700 A | | 7/2013 |

* cited by examiner

*Primary Examiner* — Ida M Soward
(74) *Attorney, Agent, or Firm* — Moser Taboada

(57) ABSTRACT

An electrode structure includes at least one reflection layer, a barrier layer, and a conductive pad. The barrier layer includes a first barrier layer and a second barrier layer. The first and second barrier layers are stacked on the reflection layer in sequence. The first and second barrier layers are made of different materials. The conductive pad is located on the barrier layer.

9 Claims, 3 Drawing Sheets

ELECTRODE STRUCTURE AND LIGHT EMITTING DIODE STRUCTURE HAVING THE SAME

RELATED APPLICATIONS

This application claims priority to Taiwan Application Serial Number 102138493, filed Oct. 24, 2013, which is herein incorporated by reference.

BACKGROUND

1. Field of Invention

The present invention relates to an electrode structure and a light emitting diode structure having the electrode structure.

2. Description of Related Art

A conventional light emitting diode structure is composed of a sapphire substrate, an epitaxial layer (e.g., N—GaN, light emitting layer, and P—GaN), a reflection layer, a barrier layer, and a conductive pad. The epitaxial layer, the reflection layer, the barrier layer, and the conductive pad are formed on the sapphire substrate. The reflection layer is usually made of aluminum to reflect light under the conductive pad, so as to enhance the light emitting efficiency of the light emitting diode structure. However, after the aluminum reflection layer has been used for a period of time, aluminum corrosion may occur from the conductive pad, which severely limits the life span of the light emitting diode structure.

Moreover, the current density of the conductive pad and the epitaxial layer may be improved to improve the light emitting efficiency of the conventional light emitting diode structure. However, the integrity of the conventional barrier layer between the conductive pad and the reflection layer is poor. After being used for a period of time, the light emitting diode structure will most likely have an increased impedance of the conductive pad. As a result, when the operation voltage is increased to drive the light emitting diode structure, the reliability analysis (RA) of the light emitting diode structure is not sufficient, such that the maximum allowable value of the current density of the conductive pad and the epitaxial layer is limited. For example, the maximum allowable current density may be two times higher than a standard current density. If the current density is over the maximum allowable current density, the light emitting diode structure will be crashed.

SUMMARY

An aspect of the present invention is to provide an electrode structure.

According to an embodiment of the present invention, an electrode structure includes at least one reflection layer, a barrier layer, and a conductive pad. The barrier layer includes a first barrier layer and a second barrier layer. The first and second barrier layers are stacked on the reflection layer in sequence. The first and second barrier layers are made of different materials. The conductive pad is located on the barrier layer.

In an embodiment of the present invention, the reflection layer is made of a material that includes metal or alloy.

In an embodiment of the present invention, the reflection layer is made of a material that includes rhodium, silver, aluminum, nickel, chromium, or alloy thereof.

In an embodiment of the present invention, the reflection layer includes a first reflection layer and a second reflection layer, or the reflection layer is formed by a plurality of first and second reflection layers alternately stacked. The first and second reflection layers are made of different metal materials or different alloy materials.

In an embodiment of the present invention, the first reflection layer is made of a material that includes nickel, chromium, or alloy thereof, and the second reflection layer is made of a material that includes rhodium, silver, aluminum, or alloy thereof.

In an embodiment of the present invention, the first and second barrier layers are made of a material that includes chromium, platinum, molybdenum, niobium, palladium, titanium, wolfram, or alloy thereof.

In an embodiment of the present invention, the barrier layer is formed by a plurality of first and second barrier layers alternately stacked.

Another aspect of the present invention is to provide a light emitting diode structure.

According to an embodiment of the present invention, a light emitting diode structure includes a substrate, an N-type semiconductor layer, a light emitting layer, a P-type semiconductor layer, and an electrode structure. The N-type semiconductor layer is located on the substrate. The light emitting layer is located on the N-type semiconductor layer. The P-type semiconductor layer is located on the light emitting layer. The electrode structure is disposed on the P-type semiconductor layer.

In an embodiment of the present invention, the light emitting diode structure further includes a current block layer. The current block layer is located between the P-type semiconductor layer and the reflection layer.

In an embodiment of the present invention, the light emitting diode structure further includes a transparent conductive layer. The transparent conductive layer located between the current block layer and the reflection layer.

In the aforementioned embodiments of the present invention, since the barrier layer having the first and second barrier layers can effectively prevent the chemical combination between the conductive pad and the reflection layer, such that the impedance of the conductive pad is not easily increased for a period of usage time. As a result, the stability of the reliability analysis of the light emitting diode structure may be improved, such that the maximum allowable value of the current density of the conductive pad, the N-type semiconductor layer, the light emitting layer, and the P-type semiconductor layer may be improved. That is to say, the light emitting efficiency of the light emitting diode structure may be improved by increasing the current density of the conductive pad and the epitaxial layer having the N-type semiconductor layer, the light emitting layer, and the P-type semiconductor layer, and the light emitting diode structure is not easily broken.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
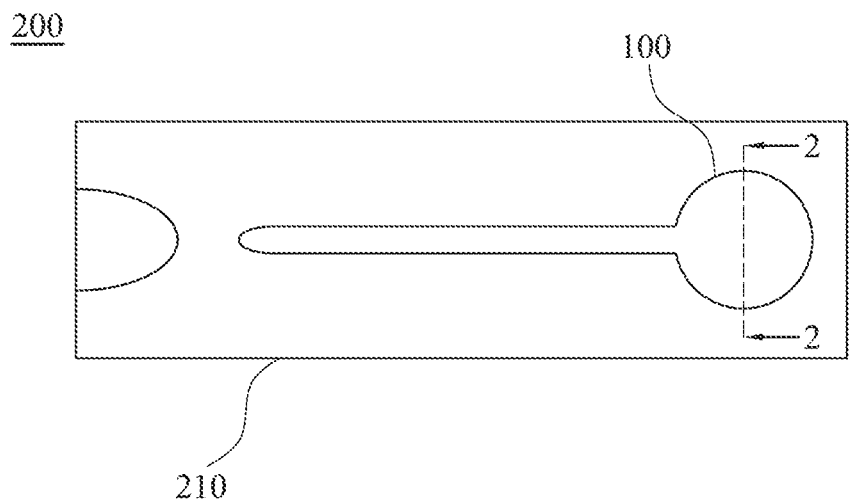
FIG. 1 is a top view of a light emitting diode structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
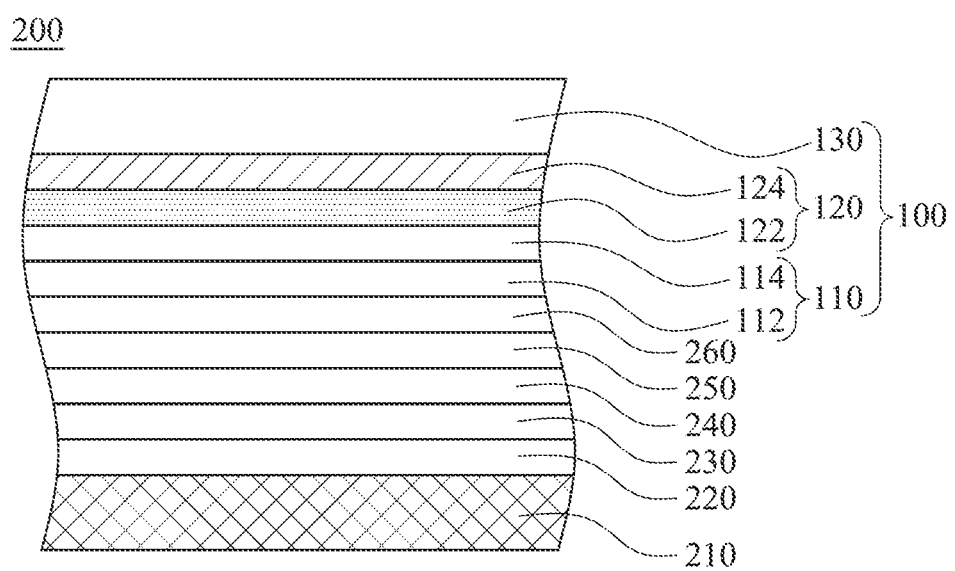
FIG. 2 is a cross-sectional view taken along line 2-2 of the light emitting diode structure shown in FIG. 1.

FIG. 1 is a top view of a light emitting diode structure 200 according to an embodiment of the present invention. FIG. 2 is a cross-sectional view taken along line 2-2 of the light emitting diode structure 200 shown in FIG. 1. As shown in FIG. 1 and FIG. 2, the light emitting diode structure 200 includes a substrate 210, an N-type semiconductor layer 220, a light emitting layer 230, a P-type semiconductor layer 240, and an electrode structure 100. The N-type semiconductor layer 220 is located on the substrate 210. The light emitting layer 230 is located on the N-type semiconductor layer 220. The P-type semiconductor layer 240 is located on the light emitting layer 230. The N-type semiconductor layer 220, the light emitting layer 230, and the P-type semiconductor layer 240 may be referred to as an epitaxial layer. The electrode structure 100 is disposed on the P-type semiconductor layer 240.

In this embodiment, the substrate 210 may be, but not limited to a sapphire substrate. The N-type semiconductor layer 220 and the P-type semiconductor layer 240 may be made of a material that includes nitride, such as the N-type semiconductor layer 220 is N—GaN, and the P-type semiconductor layer 240 is P—GaN.

The electrode structure 100 includes a reflection layer 110, a barrier layer 120, and a conductive pad 130. The barrier layer 120 includes a first barrier layer 122 and a second barrier layer 124. The first and second barrier layers 122, 124 are stacked on the reflection layer 110 in sequence, and the first and second barrier layers 122, 124 are made of different materials. The conductive pad 130 is located on the barrier layer 120. In this embodiment, the conductive pad 130 may be made of a material that includes gold or silver. The first and second barrier layers 122, 124 may be made of a material that includes chromium, platinum, molybdenum, niobium, palladium, titanium, wolfram, or alloy thereof. For example, the first barrier layer 122 may be made of a material that includes chromium, and the second barrier layer 124 may be made of a material that includes platinum.

When the light emitting diode structure 200 receives an electric power, the barrier layer 120 having the first and second barrier layers 122, 124 can effectively prevent the chemical combination between the conductive pad 130 and the reflection layer 110, such that the impedance of the conductive pad 130 is not easily increased for a period of usage time. As a result, the stability of the reliability analysis (RA) of the light emitting diode structure 200 may be improved, such that the maximum allowable value of the current density of the conductive pad 110, the N-type semiconductor layer 220, the light emitting layer 230, and the P-type semiconductor layer 240 may be improved. That is to say, the light emitting efficiency of the light emitting diode structure 200 may be improved by increasing the current density of the conductive pad 130 and the epitaxial layer, and the light emitting diode structure 200 is not easily broken. In this embodiment, the maximum allowable current density of the light emitting diode structure 200 may be five times higher than a standard current density.

The reflection layer 110 may be made of a material that includes metal or alloy. For example, reflection layer 110 may be made of a material that includes rhodium, silver, aluminum, nickel, chromium, or alloy thereof. In this embodiment, the reflection layer 110 includes a first reflection layer 112 and a second reflection layer 114, and the first and second reflection layers 112, 114 are made of different metal materials or different alloy materials. The first reflection layer 112 may be made of a material that includes nickel, chromium, or alloy thereof, and the second reflection layer 114 is made of a material that includes rhodium, silver, aluminum, or alloy thereof. For example, the first reflection layer 112 may be made of a material that includes nickel, and the second reflection layer 114 may be made of a material that includes rhodium.

When the light emitting diode structure 200 receives an electric power, the reflection layer 110 may reflect the light of the light emitting layer 230 under the conductive pad 130 to increase the path of light extraction. Therefore, the light emitting efficiency of the light emitting diode structure 200 can be increased to improve the brightness of the light emitting diode structure 200. Moreover, the reflection layer 110 may improve the adhesion of the barrier layer 120.

When the reflection layer 110 is made of a material that includes rhodium, aluminum corrosion is not formed from the conductive pad 130, such that the life span of the light emitting diode structure 200 can be increased. The numbers of the first and second reflection layers 112, 114 are not limited in the present invention. For example, the reflection layer 110 may be formed by a plurality of first and second reflection layers 112, 114 that are alternately stacked.

In this embodiment, the light emitting diode structure 200 may further include a current block (CB) layer 250 a transparent conductive layer 260. The current block layer 250 is located between the P-type semiconductor layer 240 and the reflection layer 110. The transparent conductive layer 260 is located between the current block layer 250 and the reflection layer 110. The current block layer 250 may be made of a material that includes silicon oxide, nitrogen oxide, titanium oxide, or aluminum oxide. The transparent conductive layer 260 may be made of a material that includes indium tin oxide, zinc aluminum oxide, zinc aluminum gallium oxide, or indium gallium zinc oxide.

When the light emitting diode structure 200 receives an electric power, the current block layer 250 can block a current, such that the current passing the current block layer 250 flows in a horizontal direction to decrease the probability of the light of the light emitting layer 230 shaded by the electrode structure 100, thereby improving the light output of the light emitting diode structure 200.

It is to be noted that the connection relationships and the materials of the elements described above will not be repeated in the following description. In the following description, other types of the barrier layer 120 will be described.

Figure 3:
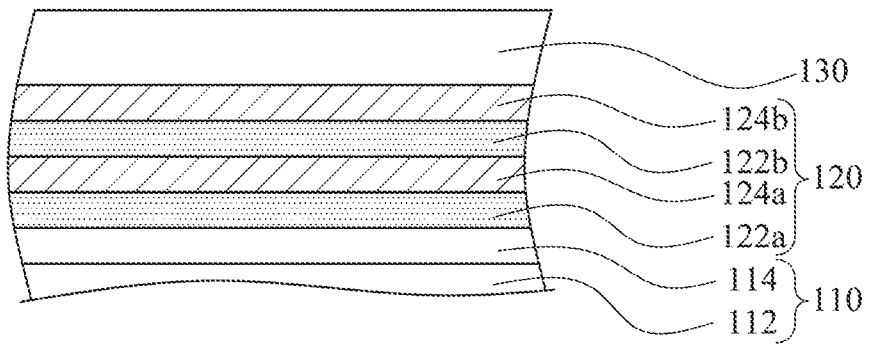
FIG. 3 is a cross-sectional view of an electrode structure according to another embodiment of the present invention, and the cross-sectional position is the same as FIG. 2.

FIG. 3 is a cross-sectional view of an electrode structure 100a according to another embodiment of the present invention, and the cross-sectional position is the same as FIG. 2. The electrode structure 100a includes the reflection layer 110, the barrier layer 120, and the conductive pad 130. The difference between this embodiment and the embodiment shown in FIG. 2 is that the barrier layer 120 is formed by two first barrier layers 122a, 122b and two second barrier layers 124a, 124b that are alternately stacked. That is to say, the first barrier layer 122a, the second barrier layer 124a, the first barrier layer 122b, and the second barrier layer 124b are stacked on the reflection layer 110 in sequence.

In this embodiment, the first barrier layers 122a, 122b are made of the same material, and the second barrier layers 124a, 124b are also made of the same material. For example, the first barrier layers 122a, 122b may be made of chromium, and the second barrier layers 124a, 124b may be made of platinum. Compared with the electrode structure 100 shown in FIG. 2, when the electrode structure 100a receives an electric power, the barrier layer 120 having the first barrier layers 122a, 122b and second barrier layers 124a, 124b can more effectively prevent the chemical combination between the conductive pad 130 and the reflection layer 110, such that the stability of the reliability analysis (RA) of a light emitting diode structure having the electrode structure 100a may be improved.

Figure 4:
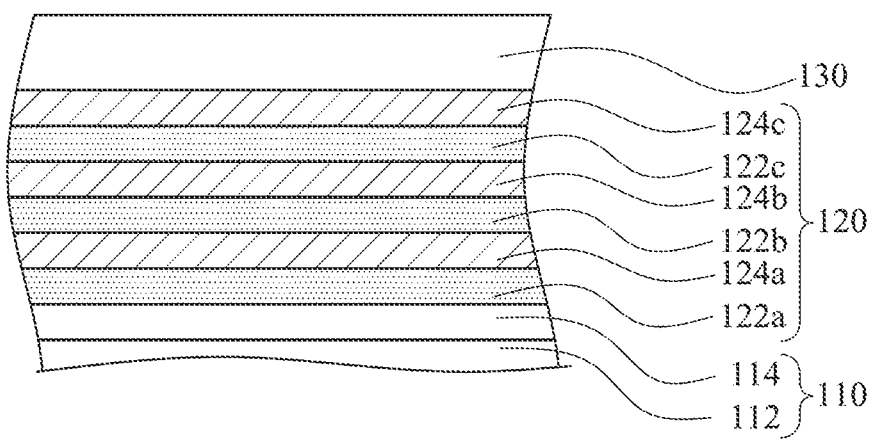
FIG. 4 is a cross-sectional view of an electrode structure according to another embodiment of the present invention, and the cross-sectional position is the same as FIG. 2.

FIG. 4 is a cross-sectional view of an electrode structure 100b according to another embodiment of the present invention, and the cross-sectional position is the same as FIG. 2. The electrode structure 100b includes the reflection layer 110, the barrier layer 120, and the conductive pad 130. The difference between this embodiment and the embodiment shown in FIG. 2 is that the barrier layer 120 is formed by three first barrier layers 122a, 122b, 122c and three second barrier layers 124a, 124b, 124c that are alternately stacked. That is to say, the first barrier layer 122a, the second barrier layer 124a, the first barrier layer 122b, the second barrier layer 124b, the first barrier layer 122c, and the second barrier layer 124c are stacked on the reflection layer 110 in sequence.

In this embodiment, the first barrier layers 122a, 122b, 122c are made of the same material, and the second barrier layers 124a, 124b, 124c are also made of the same material. For example, the first barrier layers 122a, 122b, 122c may be made of chromium, and the second barrier layers 124a, 124b, 124c may be made of platinum. Compared with the electrode structure 100a shown in FIG. 3, when the electrode structure 100b receives an electric power, the barrier layer 120 having the first barrier layers 122a, 122b, 122c and the second barrier layers 124a, 124b, 124c can more effectively prevent the chemical combination between the conductive pad 130 and the reflection layer 110, such that the stability of the reliability analysis (RA) of a light emitting diode structure having the electrode structure 100b may be improved.

Figure 5:
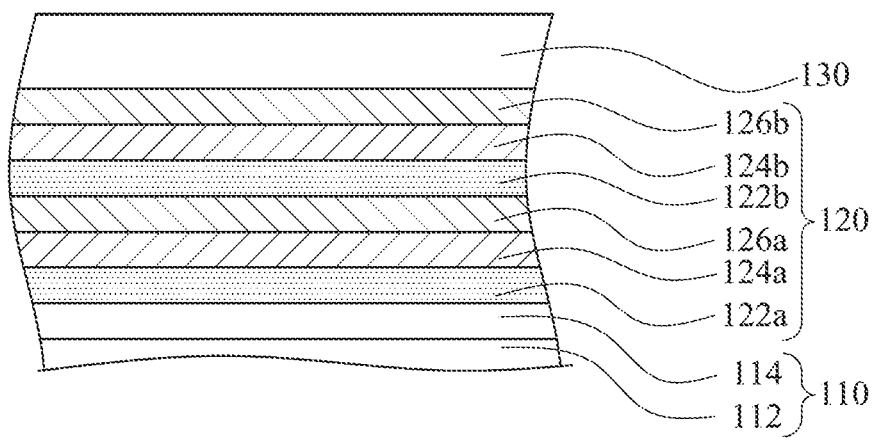
FIG. 5 is a cross-sectional view of an electrode structure according to another embodiment of the present invention, and the cross-sectional position is the same as FIG. 2.

FIG. 5 is a cross-sectional view of an electrode structure 100c according to another embodiment of the present invention, and the cross-sectional position is the same as FIG. 2. The electrode structure 100c includes the reflection layer 110, the barrier layer 120, and the conductive pad 130. The difference between this embodiment and the embodiment shown in FIG. 2 is that the barrier layer 120 further includes two third barrier layers 126a, 126b. The first barrier layer 122a, the second barrier layer 124a, the third barrier layer 126a, the first barrier layer 122b, the second barrier layer 124b, and the third barrier layer 126b are stacked on the reflection layer 110 in sequence.

In this embodiment, the first barrier layers 122a, 122b are made of the same material, the second barrier layers 124a, 124b are made of the same material, and the third barrier layers 126a, 126b are made of the same material. For example, the first barrier layers 122a, 122b may be made of chromium, the second barrier layers 124a, 124b may be made of platinum, and the third barrier layers 126a, 126b may be made of palladium. Compared with the electrode structure 100 shown in FIG. 2, when the electrode structure 100c receives an electric power, the barrier layer 120 having the first barrier layers 122a, 122b, the second barrier layers 124a, 124b, and the third barrier layers 126a, 126b can more effec-tively prevent the chemical combination between the conductive pad 130 and the reflection layer 110, such that the stability of the reliability analysis (RA) of a light emitting diode structure having the electrode structure 100c may be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electrode structure comprising:
at least one reflection layer, wherein the reflection layer comprises a first reflection layer and a second reflection layer, or the reflection layer is formed by a plurality of first and second reflection layers alternately stacked, wherein the first and second reflection layers are made of different metal materials or different alloy materials;
a barrier layer comprising a first barrier layer and a second barrier layer, wherein the first and second barrier layers are stacked on the reflection layer in sequence, and the first and second barrier layers are made of different materials; and
a conductive pad located on the barrier layer.

2. The electrode structure of claim 1, wherein the reflection layer is made of a material comprising metal or alloy.

3. The electrode structure of claim 2, wherein the reflection layer is made of a material comprising rhodium, silver, aluminum, nickel, chromium, or alloy thereof.

4. The electrode structure of claim 1, wherein the first reflection layer is made of a material comprising nickel, chromium, or alloy thereof, and the second reflection layer is made of a material comprising rhodium, silver, aluminum, or alloy thereof.

5. The electrode structure of claim 1, wherein the first and second barrier layers are made of a material comprising chromium, platinum, molybdenum, niobium, palladium, titanium, wolfram, or alloy thereof.

6. The electrode structure of claim 5, wherein the barrier layer is formed by a plurality of first and second barrier layers alternately stacked.

7. A light emitting diode structure comprising:
a substrate;
an N-type semiconductor layer located on the substrate;
a light emitting layer located on the N-type semiconductor layer;
a P-type semiconductor layer located on the light emitting layer; and
an electrode structure of claim 1 disposed on the P-type semiconductor layer.

8. The light emitting diode structure of claim 7, further comprising: a current block layer located between the P-type semiconductor layer and the reflection layer.

9. The light emitting diode structure of claim 8, further comprising: a transparent conductive layer located between the current block layer and the reflection layer.

* * * * *